(12) United States Patent
Sheats et al.

(10) Patent No.: US 8,309,949 B2
(45) Date of Patent: *Nov. 13, 2012

(54) OPTOELECTRONIC ARCHITECTURE HAVING COMPOUND CONDUCTING SUBSTRATE

(75) Inventors: James R. Sheats, Palo Alto, CA (US); Sam Kao, San Mateo, CA (US); Martin R. Roscheisen, San Francisco, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/952,174

(22) Filed: Nov. 22, 2010

(65) Prior Publication Data

US 2011/0121353 A1 May 26, 2011

Related U.S. Application Data

(63) Continuation of application No. 11/207,157, filed on Aug. 16, 2005, now Pat. No. 7,838,868, which is a continuation-in-part of application No. 11/039,053, filed on Jan. 20, 2005, now Pat. No. 7,276,724.

(51) Int. Cl.
  *H01L 29/06* (2006.01)
  *H01L 21/00* (2006.01)
(52) U.S. Cl. ............ 257/21; 257/22; 257/E31.127; 257/E31.129; 438/22; 438/24; 438/34
(58) Field of Classification Search ............ 438/24–26, 438/28, 34, 39, 22; 257/E31.127, E31.129, 257/21, 22; *H01L 29/06, 21/00*
See application file for complete search history.

(56) References Cited

U.S. PATENT DOCUMENTS

| | | | |
|---|---|---|---|
| 3,423,301 | A | 1/1969 | Stearns |
| 3,586,541 | A | 6/1971 | Chamberlin |
| 3,818,324 | A | 6/1974 | Espinasse |
| 3,903,427 | A | 9/1975 | Pack |
| 3,903,428 | A | 9/1975 | DeJong |
| 3,966,499 | A | 6/1976 | Yasui |
| 3,966,568 | A | 6/1976 | Crossley et al. |
| 4,191,794 | A | 3/1980 | Shirland et al. |
| 4,192,721 | A | 3/1980 | Fawcett et al. |

(Continued)

FOREIGN PATENT DOCUMENTS

CN   1036298 A   11/1998

(Continued)

OTHER PUBLICATIONS

Xue et al., "4.2% efficient organic photovoltaic cells with low series resistances", Appl. Phys. Lett. 84, 3013 (2004).

(Continued)

*Primary Examiner* — Hsien Ming Lee

(57) ABSTRACT

Optoelectronic device modules, arrays optoelectronic device modules and methods for fabricating optoelectronic device modules are disclosed. The device modules are made using a starting substrate having an insulator layer sandwiched between a bottom electrode made of a flexible bulk conductor and a conductive back plane. An active layer is disposed between the bottom electrode and a transparent conducting layer. One or more electrical contacts between the transparent conducting layer and the back plane are formed through the transparent conducting layer, the active layer, the flexible bulk conductor and the insulating layer. The electrical contacts are electrically isolated from the active layer, the bottom electrode and the insulating layer.

20 Claims, 6 Drawing Sheets

U.S. PATENT DOCUMENTS

| | | | |
|---|---|---|---|
| 4,227,942 A | 10/1980 | Hall | |
| 4,243,432 A | 1/1981 | Jordan et al. | |
| 4,404,422 A | 9/1983 | Green et al. | |
| 4,485,264 A | 11/1984 | Izu et al. | |
| 4,499,658 A | 2/1985 | Lewis | |
| 4,522,663 A | 6/1985 | Ovshinsky et al. | |
| 4,536,607 A | 8/1985 | Wiesmann | |
| 4,559,924 A | 12/1985 | Wilhelm | |
| 4,574,160 A | 3/1986 | Cull | |
| 4,622,432 A | 11/1986 | Yamazaki | |
| 4,642,140 A | 2/1987 | Noufi et al. | |
| 4,677,250 A | 6/1987 | Barnett et al. | |
| 4,755,475 A | 7/1988 | Kiyama et al. | |
| 4,773,944 A | 9/1988 | Nath | |
| 4,786,607 A | 11/1988 | Yamazaki et al. | |
| 4,806,436 A | 2/1989 | Tada et al. | |
| 4,849,029 A | 7/1989 | Delahoy | |
| 4,860,509 A | 8/1989 | Laaly et al. | |
| 4,865,999 A | 9/1989 | Xi et al. | |
| 4,872,925 A | 10/1989 | McMaster | |
| 4,940,604 A | 7/1990 | Suyama et al. | |
| 4,981,525 A | 1/1991 | Kiyama et al. | |
| 5,045,409 A | 9/1991 | Eberspacher et al. | |
| 5,057,163 A | 10/1991 | Barnett et al. | |
| 5,078,804 A | 1/1992 | Chen et al. | |
| 5,093,453 A | 3/1992 | St Clair et al. | |
| 5,139,959 A | 8/1992 | Craft et al. | |
| 5,141,564 A | 8/1992 | Chen et al. | |
| 5,244,509 A | 9/1993 | Arao et al. | |
| 5,254,179 A | 10/1993 | Ricaud et al. | |
| 5,268,037 A | 12/1993 | Glatfelter | |
| 5,277,786 A | 1/1994 | Kawakami | |
| 5,286,306 A | 2/1994 | Menezes | |
| 5,356,839 A | 10/1994 | Tuttle et al. | |
| 5,401,573 A | 3/1995 | Babel et al. | |
| 5,419,781 A | 5/1995 | Hamakawa et al. | |
| 5,421,908 A | 6/1995 | Yoshida et al. | |
| 5,436,204 A | 7/1995 | Albin et al. | |
| 5,441,897 A | 8/1995 | Noufi et al. | |
| 5,468,652 A | 11/1995 | Gee | |
| 5,501,744 A | 3/1996 | Albright | |
| 5,547,516 A | 8/1996 | Luch | |
| 5,558,723 A | 9/1996 | Ufert | |
| 5,578,503 A | 11/1996 | Karg et al. | |
| 5,587,264 A | 12/1996 | Iijima et al. | |
| 5,626,686 A | 5/1997 | Yoshida | |
| 5,626,688 A | 5/1997 | Probst et al. | |
| 5,633,033 A | 5/1997 | Nishitani et al. | |
| 5,637,537 A | 6/1997 | Nath et al. | |
| 5,667,596 A | 9/1997 | Tsuzuki et al. | |
| 5,674,325 A | 10/1997 | Albright et al. | |
| 5,677,250 A | 10/1997 | Knapp | |
| 5,679,176 A | 10/1997 | Tsuzuki et al. | |
| 5,681,402 A | 10/1997 | Ichinose et al. | |
| 5,730,852 A | 3/1998 | Bhattacharya et al. | |
| 5,733,381 A | 3/1998 | Ota et al. | |
| 5,735,966 A | 4/1998 | Luch | |
| 5,759,291 A | 6/1998 | Ichinose et al. | |
| 5,865,904 A | 2/1999 | Tanda | |
| 5,868,869 A | 2/1999 | Albright et al. | |
| 5,897,715 A | 4/1999 | Ward et al. | |
| 5,925,228 A | 7/1999 | Panitz et al. | |
| 5,928,439 A | 7/1999 | Ota et al. | |
| 5,951,786 A | 9/1999 | Gee et al. | |
| 5,985,691 A | 11/1999 | Basol et al. | |
| 5,994,163 A | 11/1999 | Bodegaard et al. | |
| 6,034,322 A | 3/2000 | Pollard | |
| 6,034,810 A | 3/2000 | Robinson et al. | |
| 6,083,801 A | 7/2000 | Ohtani | |
| 6,107,562 A | 8/2000 | Hashimoto et al. | |
| 6,121,541 A | 9/2000 | Arya | |
| 6,124,039 A | 9/2000 | Goetz et al. | |
| 6,127,202 A | 10/2000 | Kapur et al. | |
| 6,130,465 A | 10/2000 | Cole | |
| 6,201,181 B1 | 3/2001 | Azzam et al. | |
| 6,239,352 B1 | 5/2001 | Luch | |
| 6,265,652 B1 | 7/2001 | Kurata et al. | |
| 6,268,014 B1 | 7/2001 | Eberspacher et al. | |
| 6,333,206 B1 | 12/2001 | Ito et al. | |
| 6,359,209 B1 | 3/2002 | Glenn et al. | |
| 6,372,538 B1 | 4/2002 | Wendt et al. | |
| 6,414,235 B1 | 7/2002 | Luch | |
| 6,437,231 B2 | 8/2002 | Kurata et al. | |
| 6,455,347 B1 | 9/2002 | Hiraishi et al. | |
| 6,459,032 B1 | 10/2002 | Luch | |
| 6,468,828 B1 | 10/2002 | Glatfelter et al. | |
| 6,511,861 B2 | 1/2003 | Takeyama et al. | |
| 6,553,729 B1 | 4/2003 | Nath et al. | |
| 6,573,445 B1 | 6/2003 | Burgers | |
| 6,729,081 B2 | 5/2004 | Nath et al. | |
| 6,750,662 B1 | 6/2004 | Van Der Heide | |
| 6,774,497 B1 | 8/2004 | Qi et al. | |
| 6,787,405 B2 | 9/2004 | Chen | |
| 6,803,513 B2 | 10/2004 | Beemink et al. | |
| 6,846,696 B2 | 1/2005 | Adachi et al. | |
| 6,974,976 B2 | 12/2005 | Hollars | |
| 7,122,398 B1 | 10/2006 | Pichler | |
| 7,144,751 B2 | 12/2006 | Gee et al. | |
| 7,170,001 B2 | 1/2007 | Gee et al. | |
| 7,276,724 B2 | 10/2007 | Sheats et al. | |
| 7,507,903 B2 | 3/2009 | Luch | |
| 7,507,971 B2 | 3/2009 | Shibayama et al. | |
| 7,635,810 B2 | 12/2009 | Luch | |
| 7,732,243 B2 | 6/2010 | Luch | |
| 7,838,868 B2 * | 11/2010 | Sheats et al. | 257/21 |
| 7,898,053 B2 | 3/2011 | Luch | |
| 7,898,054 B2 | 3/2011 | Luch | |
| 2001/0020486 A1 | 9/2001 | Tsuge | |
| 2002/0189662 A1 | 12/2002 | Lomparski | |
| 2003/0103181 A1 | 6/2003 | Imayama et al. | |
| 2003/0198587 A1 | 10/2003 | Kaloyeros et al. | |
| 2003/0205270 A1 | 11/2003 | Stanbery | |
| 2003/0227021 A1 | 12/2003 | Yamazaki et al. | |
| 2004/0069340 A1 | 4/2004 | Luch | |
| 2004/0144419 A1 | 7/2004 | Fix | |
| 2004/0187917 A1 | 9/2004 | Pichler | |
| 2004/0214409 A1 | 10/2004 | Famworth et al. | |
| 2004/0219730 A1 | 11/2004 | Basol | |
| 2004/0261839 A1 | 12/2004 | Gee et al. | |
| 2004/0261840 A1 | 12/2004 | Schmit et al. | |
| 2005/0006714 A1 | 1/2005 | Graetzel et al. | |
| 2005/0061363 A1 | 3/2005 | Ginley et al. | |
| 2005/0072457 A1 | 4/2005 | Glenn | |
| 2005/0087225 A1 | 4/2005 | Morooka et al. | |
| 2005/0109392 A1 | 5/2005 | Hollars | |
| 2005/0117194 A1 | 6/2005 | Kim et al. | |
| 2005/0126621 A1 | 6/2005 | Dinwoodie et al. | |
| 2005/0135724 A1 | 6/2005 | Helvajian et al. | |
| 2005/0172996 A1 | 8/2005 | Hacke et al. | |
| 2005/0172998 A1 | 8/2005 | Gee et al. | |
| 2005/0175856 A1 | 8/2005 | Rogers et al. | |
| 2005/0176164 A1 | 8/2005 | Gee et al. | |
| 2005/0176270 A1 | 8/2005 | Luch | |
| 2005/0183767 A1 | 8/2005 | Yu et al. | |
| 2005/0186342 A1 | 8/2005 | Sager et al. | |
| 2005/0217719 A1 | 10/2005 | Mahieu et al. | |
| 2005/0241692 A1 | 11/2005 | Rubin et al. | |
| 2005/0263178 A1 | 12/2005 | Montello et al. | |
| 2005/0263179 A1 | 12/2005 | Gaudiana et al. | |
| 2005/0263180 A1 | 12/2005 | Montello et al. | |
| 2005/0274408 A1 | 12/2005 | Li et al. | |
| 2006/0030141 A1 | 2/2006 | Weng et al. | |
| 2006/0032752 A1 | 2/2006 | Luch | |
| 2006/0107471 A1 | 5/2006 | Spath et al. | |
| 2006/0118165 A1 | 6/2006 | Van Roosmalen et al. | |
| 2006/0121701 A1 | 6/2006 | Basol | |
| 2006/0121748 A1 | 6/2006 | Brieko | |
| 2006/0160261 A1 | 7/2006 | Sheats et al. | |
| 2006/0180195 A1 | 8/2006 | Luch | |
| 2007/0283996 A1 | 12/2007 | Hachtmann et al. | |
| 2007/0283997 A1 | 12/2007 | Hachtmann et al. | |
| 2008/0011350 A1 | 1/2008 | Luch | |
| 2008/0053519 A1 | 3/2008 | Pearce et al. | |
| 2008/0227236 A1 | 9/2008 | Luch | |
| 2008/0314433 A1 | 12/2008 | Luch | |
| 2009/0107538 A1 | 4/2009 | Luch | |
| 2009/0111206 A1 | 4/2009 | Luch | |

| | | | |
|---|---|---|---|
| 2009/0145551 | A1 | 6/2009 | Luch |
| 2009/0169722 | A1 | 7/2009 | Luch |
| 2009/0173374 | A1 | 7/2009 | Luch |
| 2009/0223552 | A1 | 9/2009 | Luch |

FOREIGN PATENT DOCUMENTS

| | | | |
|---|---|---|---|
| DE | 2741954 | A | 3/1979 |
| EP | 452588 | A1 | 10/1991 |
| EP | 793277 | A | 9/1997 |
| JP | 60000783 | A | 5/1985 |
| JP | 6289369 | | 4/1987 |
| JP | 63249379 | A | 10/1988 |
| JP | 2051282 | A | 2/1990 |
| JP | 6196743 | | 7/1994 |
| WO | 8904062 | A1 | 5/1989 |
| WO | 9324960 | A1 | 9/1993 |
| WO | 02084708 | | 10/2002 |
| WO | 03007386 | | 1/2003 |
| WO | 03001602 | A2 | 3/2003 |
| WO | 2004100244 | A1 | 11/2004 |
| WO | 2005006402 | A2 | 1/2005 |
| WO | 2005018007 | | 2/2005 |
| WO | 2005076959 | | 8/2005 |
| WO | 2005076960 | | 8/2005 |
| WO | 2005086633 | | 9/2005 |
| WO | 2006033858 | | 3/2006 |
| WO | 2006078985 | A2 | 7/2006 |
| WO | 2007022221 | | 2/2007 |

OTHER PUBLICATIONS

Yukimi Ichikawa, Shinji Fujikake, Katsuya Tabuchi, Toshiaki Sasaki, Toshio Hama, Takashi Yoshida, Hiroshi Sakai, Misao Saga, Flexible A-Si Based Solar Cells with Plastic Film Substrate, Mst. Res. Soc. Symp. Proc. vol. 557. (1999) p. 703-712.

K. Tabuchi, S. Fujikake, H. Sato, S. Saito, A. Takano, T. Wada, T. Yoshida, Y. Ichikawa, H. Sakai, F. Natsume, Improvement of Large-Area Scaf Structure A-Si Solar Cells with Plastic Film Substrate, Conference Record of the Twenty-Sixth IEEE Photovoltaic Specialists Conference, Sep. 29-Oct. 3, 1997.

K.T. Ramakrishna Reddy, R.B.V. Chalapathy, M.A. Slifkin, A.W. Weiss, and R.W. Miles, Photoacousstic spectroscopy of sprayed CuGaxinl_xSe2 thin films, Thin Solid Films, 2001, 205-207, vol. 387, Elsevier Science, Amsterdam: Netherlands.

K.T.L. De Silva, W.A.A. Priyantha, J.K.D.S. Jayanetti, B.D. Chithrani, W. Siripala, K. Blake, and I.M. Dharmadasa, Electrodeposition and characterization of CuInSe2 for applications in thin film solar cells, Thin Solid Films, 2001, 158-163, vol. 382, Elsevier Science, Amsterdam : Netherlands.

Ki Tae Nam, Arindom Datta, Soo-Hyun Kim, and Ki-Bum Kim, Improved diffusion barrier by stuffing the grain boundaries of TiN with a thin Al interlayer for Cu metallization, Applied Physics Letters, Oct. 15, 2001, 2549-2551, vol. 79, No. 16, American Institute of Physics, New York.

Kray, et al, "High-Efficiency Emitter-Wrap-Through Cells", 17.sup. th EU- PVSEC Munich (2001), Oct. 2001.

L. Gao, J. Gstottner, R. Emling, M. Balden, Ch. Linsmeier, A. Wiltner, W. Hansch, and D. Schmittlandsiedel, Thermal stability oftitanium nitride diffusion barrier films for advanced silver interconnects, Microelectronic Engineering, Oct. 2004, 76-81, vol. 76, Issue 1-4, Elsevier Science Ltd., Oxford, UK.

M. Kaelin, D. Rudmann, F. Kurdesau, T. Meyer, H. Zogg, A.N. Tiwari, CIS and CIGS layers from selenized nanoparticle precursors, Thin Solid Films, 2003, 58-62, vol. 431-432, Elsevier Science, Amsterdam : Netherlands.

M. Kaelin, H. Zogg, A.N. Tiwari, O. Wilhelm, S.E. Pratsinis, T. Meyer, and A. Meyer, Electrosprayer and selenized CuIn metal particle films, Thin Solid Films, 2004, 391-396, vol. 457, Elsevier Science, Amsterdam: Netherlands.

M. Mandl, H. Hoffmann, and P. Kucher, Diffusion barrier properties ofTilTiN investigated by transmission electron microscopy, Journal of Applied Physics, Sep. 1, 1990,2127-2132, vol. 68, No. 5, American Institute of Physics, New York.

Marianna Kemell, Heini Saloniemi, Mikko Ritala, and Markku Leskela, Electrochemical Quartz Crystal Microbalance Study of the Electrodeposition Mechanisms ofCulnSe2 Thin Films, Journal of the Electrochemical Society, 2001, C110- C118, vol. 148, No. 2, Electrochemical Society: USA.

Markus E. Beck, and Michael Cocivera, Thin-film copper indium diselenide prepared by selenization of copper indium oxide formed by spray pyrolysis, Thin Solid Films, 1996, 71-82, vol. 272, Elsevier Publishing Company, Amsterdam.

Miasole Solution from bttr:/h.vww.miasole.com/solution/asr 2003.

Office Action from Chinese patent application Ser. No. 200680006141.8 Mar. 30, 2011.

Office Action from Chinese patent application Ser. No. 200680006141.8 Mar. 6, 2009.

P.C. Dejong, D.W.K. Eikelboom, R. Kinderman, A.C. Tip, J.H. Bultman, M.H.H. Meuwissen, M.A.C.J. Van Den Nieuwenhof, Single-Step Laminated Full-Size PV Modules Made with Back-Contacted me- SI Cells and Conductive Adhesives, 19th EPVSEC, Paris, Jun. 2004.

PCT Written Opinion for W02007106756 dated Sep. 29, 2008.

R.P. Raffaelle, J.G. Mantovani, S.G. Bailey, A.F. Hepp, E.M. Gordon and R. Haraway, Electrodeposited CuInSe2 thin film junctions, Prepared for the 1997 Fall meeting sponsored by the Materials Research Society, Dec. 1-5, 1997, Boston, MA.

Roo-Jeong Lee, Robert Sinclair, Pamela Li, and Bruce Roberts, A study of the failure mechanism of a titanium nitride diffusion barrier, Journal of Applied Physics, Sep. 15, 1999, 3096-3103, vol. 86, No. 6, American Institute of Physics, New York.

S. Wiedeman et al. "CIGS Processing on a Flexible Polyimide Substrates." Proc. 2001 NCPV Program Review Meeting, p. 49-50 (2001).

Shinji Fujikake, Masayoshi Uno, Shinji Iwasaki, Yukio Takeda, Takehito Wada, Masayuki Tanda, Akihiro Takano, Takashi Yoshida, Fabrication Technologies for Large-Area Plastic-Film-Substrate Solar Cells, Proceedings of3rd World Conference on Photovoltaic Energy Conversion, 2003, vol. 2, Issue, May 12-16, 2003 pp. 1760-1763 vol. 2.

Shixing Weng and Michael Cocivera, Preparation of copper indium diselenide by selenization of copper indium oxide, Journal of Applied Physics, Aug. 1, 1993, 2046-2052, vol. 74, No. 3, American Institute of Physics, New York.

Soo-Hyun Kim, Ki Tae Nam, Arindom Datta, and Ki-Bum Kim, Failure mechanism of a multilayer (TiN/AliTiN) diffusion barrier between copper and silicon, Journal of Applied Physics, Nov. 1, 2002, 5512-5519, vol. 92, No. 9, American Institute of Physics, New York.

T. Arita, N. Suyama, Y. Kita, S. Kitamura, T. Hibino, H. Takada, K. Omura, N. Ueno, and M. Murozono, CuInSe2 films prepared by screen-printing and sintering method, 1988, IEEE.

T. Yoshida, S. Fujikake, S. Kato, M. Tanda, K. Tabuchi, A. Takano, Y. Ichikawa, H. Sakai, Development of Process Technologies for Plastic-film Substrate Solar Cells, Solar Energy Materials and Solar Cells 48 (1997) 383-391.

Vijay K. Kapur, Ashish Bansal, Phucan Le, and Omar I. Asensio, Non- vacuum processing of Cuirl_xGaxSe2 solar cells on rigid and flexible substrates using nanoparticle precursor inks, Thin Solid Films, 2003, 53-57, vol. 431-432, Elsevier Publishing Company, Amsterdam.

W. Sinke, G. P. A. Frijlink, and F. W. Saris, Oxygen in titanium nitride diffusion barriers, Applied Physics Letters, Sep. 1, 1985, 471-473, vol. 47, No. 5, American Institute of Physics, New York.

William M. Saltman and Norman H. Nachtrieb, The Electrochemistry of Gallium, Journal of the Electrochemical Society, Mar. 1953, 126-130, vol. 100, No. 3, Electrochemical Society Inc: USA.

"Global Soalr Process" slides 9,.10, 11,23,24 presented at 29m IEEE PVSC, Polycrystalline Thin-Film Solar Cells-Manufacturing Technology, Part 2, May 18-25, 2002, New Orleans, LA.

A. Duggal et al., "OLEDs for Lighting: new Approaches" in Organic Light-Emitting Materials and Devices VII edited by Sakya H. Katafi, Paul A. Lane, Proceedings ofSPIE vol. 5214 pp. 241-247 (SPIE, Bellingham, WA, Feb. 2004).

A. G. Munoz, S. B. Saidman, and J. B. Bessone, Electrodeposition ofIndium onto Vitreous Carbon from Acid Chloride Solutions, Journal of the Electrochemical Society, 1999, 2123-2130, vol. 146, No. 6, Electrochemical Society Inc: USA.

A. Kampmann, P. Cowache, D. Lincot, and J. Vedel, Juction Formation Studies of One-Step Electrodeposited CuInSe2 on CdS, Journal of the Electrochemical Society, 1999, 150-155, vol. 146, No. 1, Royal Society of Chemistry (Great Britain).

A. Kohlhase, M. Mandl, and W. Pamler, Performance and failure mechanisms of TiN diffusion barrier layers in submicron devices, Journal of Applied Physics, Mar. 15, 1989,2464-2469, vol. 65, No. 6, American Institute of Physics, New York.

A. R. Burgers, J.A. Eikelboom, Optimizing Metalization Patterns for Yearly Yield, Conference Record of the Twenty-Sixth IEEE Photovoltaic Specialists Conference, Sep. 29-Oct. 3, 1997 pp. 219-222.

A. Schonecker, D.W.K. Eikelboom, P. Manshanden, M.J.A.A. Goris, G.P. Wyers, et al., Ace Designs: The Beauty of Rear Contact Solar Cells, 29th IEEE Photovoltaic Specialists Conference, May 2002.

A. Schonecker, D.W.K. Eikelboom, P. Manshanden, M.J.A.A. Goris, G.P. Wyers, et al., Ace Designs: The Beauty of Rear Contact Solar Cells, 29th IEEE Photovoltaic Specialists Conference, May 2002 (pre print).

A. Schonecker, D.W.K. Eikelboom, P. Manshanden, M.J.A.A. Goris, G.P. Wyers, et al., Advanced Crystalline Silicon Solar Cell Designs, Final Report of European Commission project, JOR3-CT98-02692, (2001).

A. Schonecker, H.H.C. De Moor, A.R. Burgers, A.W. Weeber, J. Hoornstra, et al., An Industrial Multi-Crystalline EWT Solar Cell With Screen Printed Metallisation, 14th Eur. Photovoltaic Solar Energy Conference and Exhibition, Barcelona, Spain,(1997).

A.R. Burgers, How to Design Optimal Metallisation Patterns for Solar Cells, Prog. Photovolt: Res. Appl. 7, 457-461 (1999).

A.R. Burgers, J.H. Bultman, A.C. Tip, W.C. Sinke, Metallisation Patterns for Interconnection Through Holes, Solar Energy Materials & Solar Cells 65 (2001) 347-353.

Akahiro Takano, Tomoyoshi Kamoshita, Light-Weight and Large-Area Solar Cell Production Technology, Japanese Journal of Applied Physics, vol. 43, No. 12,2004, pp. 7976-7983.

Arindom Datta, Ki Tae Name, Soo-Hyun Kim, and Ki-Bum Kim, Optimization of Al interlayer thichness for the multilayer diffusion barrier scheme in Cu metallization, Journal of Applied Physics, Jul. 15, 2002, 1099-1105, vol. 92, No. 2, American Institute of Physics, New York.

Bultman, J.H.; Eikelboom, D.W.K.; Kinderman, R.; Tip, A.C.; Weeber, A.W.; Meuwissen, M.H.H.; Nieuwenhof, M.A.C.J. Van Den; Michiels, P.P.; Schoofs, C.; Schuurmans, F.M., Selecting optimal interconnection methodology for easy and cost efficient Manufacturing of the pin up module ECN-RX—02-051; Oct. 2002; 4 pag.; Presented at PV in Europe—From PV Technology to Energy Solutions Conference and Exhibition, Rome, Italy, Oct. 7-11, 2002.

C. Eberspacher, K. Pauls, and J. Serra, Non-vacuum processing of CIGS solar cells, UNISUN, 223-224, 2001, Newbury Park, CA.

C. Eberspacher, K. Pauls, and J. Serra, Non-vacuum processing of CIGS solar cells, UNISUN, pp. 1-5, 2003 Newbury Park, CA.

C. Guillen, and J. Herrero, Recrystallization and components redistribution processes in electrodeposited CuInSe2 thin films, Thin Solid Films, 2001, 57-59, vol. 387, Elsevier Science, Amsterdam : Netherlands.

Chinese Office Action from Chinese Application 200580036909.1 Feb. 6, 2009.

Chinese Office Action from Chinese Application 200580036909.1 Jun. 20, 2008.

Chinese Office Action from Chinese Application 200580036909.1 Sep. 25, 2009.

Chinese Office Action from Chinese Application 20060034955.2 Aug. 12, 2010.

Chinese Office Action from Chinese Application 20060034955.2 Aug. 15, 2011.

Chris Eberspacher, Chris Fredric, Karen Pauls, and Jack Serra, Thin-filme CIS alloy PV materials fabricated using non-vacuum, particles-based techniques, Thin Solid Films, 2001, 18-22, vol. 387, Elsevier Publishing Company, Amsterdam.

Chris Eberspacher, Karen L. Pauls, and John P. Serra, Non-vacuum thin-film CIGS modules, Materials Research Society Symposia Proceedings, 2003, B8.27.1-B8.27.6, vol. 763, Materials Research Society, Warrendale, PA.

Claire J. Carmalt, Daniel E. Morrison, and Ivan P. Parkin, Solid-state and solution phase metathetical synthesis of copper indium chalcogenides, Journal of Materials Chemistry, 1998, 2209-2211, vol. 8, No. 10, Royal Society of Chemistry (Great Britain).

D. Padhi, J. Yahalom, S. Gandikota, and G. Dixit, Planarization of Copper Thin Films by Electropolishing in Phosphoric Acid for ULSI Applications, Journal of the Electrochemical Society, 2003, G10-G14, vol. 150, No. 1, Electrochemical Society Inc : USA.

David D. Smith, James M. Gee, Review of Back Contact Silicon Solar Cells for Low Cost Application, 161 European Photovoltaic Solar Energy, h Conference, Glasgow, May 2000.

Douglas L. Schulz, Calvin J. Curtis, Rebecca A. Flitton, Holm Wiesner, James Keane, Richard J. Matson, Kim M. Jones, Philip A. Parilla, Rommel Noufi, and David S. Ginley, Cu-In-Ga-Se Nanoparticle Colloids as Spray Deposition Precursors for Cu(In, Ga)Se2 Solar Cell Materials, Journal of Electronic Materials, 1998, 433-437, vol. 27, No. 5, Minerals Metals & Materials Society : USA.

E. Van Kerschaver, C. Allebe, G. Beaucarne, Optimized Adaptive Back Contacted Solar Cells, 191 EPVSEC, Paris, Jun. 2004.

E. Van Kerschaver, S. De Wolf, C. Allebe, J. Szlufcik, High Performance Modules Based on Back Contacted Solar Cells, 17th Dur. PV Solar Energy Conf., Munich, Germany, Oct. 2001.

Eikelboom, D.W.K.; Bultman, J.H.; Schonecker, A.; Meuwissen, M.H.H.; Nieuwenhof, M.A.C.J. Van Den; Meier, D.L., Conductive adhesives for low-stress interconnection of thin back-contact solar cells ECN-RX—02-052; Oct. 2002; 4 pag.; Presented at PV in Europe- From PV Technology to Energy Solutions Conference and Exhibition, Rome, Italy, Oct. 7-11, 2002.

Eikelboom, D.W.K.; Burgers, A.R.; Goris, M.J.A.A.; Manshanden, P.; Schonecker, A.; Wyers, G.P., Conductive adhesives for interconnection of busbarless emitter wrap-through solar cells on a structured metal foil, ECN-RX—01-016; Oct. 2001; 4 pages; Presented at 17th European Photovoltaic Solar Energy Conference, Munich, Germany, Oct. 22-26, 2001.

European Office Action from EP application 05 796 064.3 Mar. 10, 2008.

European Office Action from EP application 05 796 064.3 Oct. 19, 2007.

G. Norsworthy, C.R. Leidholm, A. Halani, V.K. Kapur, R. Roe, B.M. Basol, and R. Matson, CIS film growth by metallic ink coating and selenization, Solar Energy Materials & Solar Cells, 2000, 127-134, vol. 60, Elsevier Science, Amsterdam : Netherlands.

George L. Schnable and John G. Javes, Electrodeposition of Molten Low-Melting Metals and Alloys from Fused-Salt Systems, Electrochemical Technology, Jul.-Aug. 1964, 201-206, Electrochemical Society, Manchester, N. H.

George L. Schnable, Electrodeposition of Molten Metals and Alloys from Glycerine Solutions, Jounal of the Electrochemical Society, Oct. 1961, 964-969, vol. 108, No. 10, Electrochemical Society Inc : USA.

H. Knauss, P. Fath, W. Jooss, M. Mccann, E. Ruland, S. Steckemetz, Large Area Metallisation Wrap Through Solar Cells With Thickfilm Metallisation, 20th European Solar Energy Conference and Exhibition, Jun. 6-10, 2005 Barcelona, Spain.

H. Knauss, W. Jooss, S. Roberts, T.M. Bruton, R. Toelle, P. Fath, E. Bucher, Emitter Wrap Through Solar Cells using Electroless Plating Metallisation, 17th European PVSEC, Oct. 2001 Paper VC3-9.

J. 0. Olowolafe, Han Li, J. W. Mayer, and E. G. Colgan, Effects of oxygen in TiNx on the diffusion of Cu in CuITiN/Ai and CuITiNx/Si structures, Applied Physics Letters, Feb. 4, 2001, 469-471, vol. 58, No. 5, American Institute of Physics, New York.

J. Bonitz, S.E. E Schultz, T. Gessner, Ultra Thin CVD TiN Layers As Diffusion Barrier Films on Porous Low-K Mateirals, Microelec. Eng. V76, p. 28, 2004.

J. Jay Wimer in "3-D Chip Scale with Lead-Free Processes" in Semiconductor International, Oct. 1, 2003.

J.H. Bultman, A.W. Weeber, M.W. Brieko, J. Hoonstra, et al., Pin Up Module: A Design For Higher Efficiency, Easy Module Manufacturing And Attractive Appearance, ECN-RX—00-010; May 2000; 4 pag.; Presented at 16th European Photovoltaic Solar Energy Conference and Exhibition, Glasgow, Scotland, May 1-5, 2000.

J.H. Bultman, D.W.K. Eikelboom, R. Kinderman, A.C. Tip, C.J.J. Tool, et al., Fast and Easy Single Step Module Assembly for Back-Contacted C-Si Solar Cells with Conductive Adhesives, Proceedings of 3rd World Conference on Photovoltaic Energy Conversion, 2003, Publication Date: May 11-18, 2003 vol. 1, On pp. 979-982 vol. 1.

J.H. Bultman, M.W. Brieko, A.R. Burgers, J. Hoornstra, A.C. Tip, A.W. Weeber, Interconnection Through Vias for Improved Efficiency and Easy Module Manufacturing of Crystalline Silicon Solar Cells, Solar Energy Materials & Solar Cells 65 (2001) 339-345.

J.-S. Chun, P. Desjardins, C. Lavoie, C.-S. Shin, C. Cabral, Jr., I. Petrov and J. E. Greene, Interfacial reactions in epitaxial Al/TiN(111) model diffusion barriers: Formation of an impervious self-limited wurtzite-structure AlN(0001) blocking layer, Journal of Applied Physics, Jun. 15, 2001, 7841-7845, vol. 89, No. 12, American Institute of Physics, New York.

J.X. Liao, L.F. Xia, M.R. Sun, W.M. Liu, T.Xu, C.R. Yang, H.W. Chen, C.L. Fu, W.J. Leng, Structural Characteristics of 2024 Aluminum Alloy Plasma-based Ion Implanted with Nitrogen then Titanium, Applied Surface Sciences 240, online Sep. 2, 2004, Elsevier Science Ltd., Oxford, UK.

James M. Gee, Stephan E. Garrett, William P. Morgan, Simplified Module Assembly Using Back-Contact Crystalline-Silicon Solar Cells, Conference Record of the Twenty-Sixth IEEE Photovoltaic Specialists Conference, Sep. 29-Oct. 3, 1997.

* cited by examiner

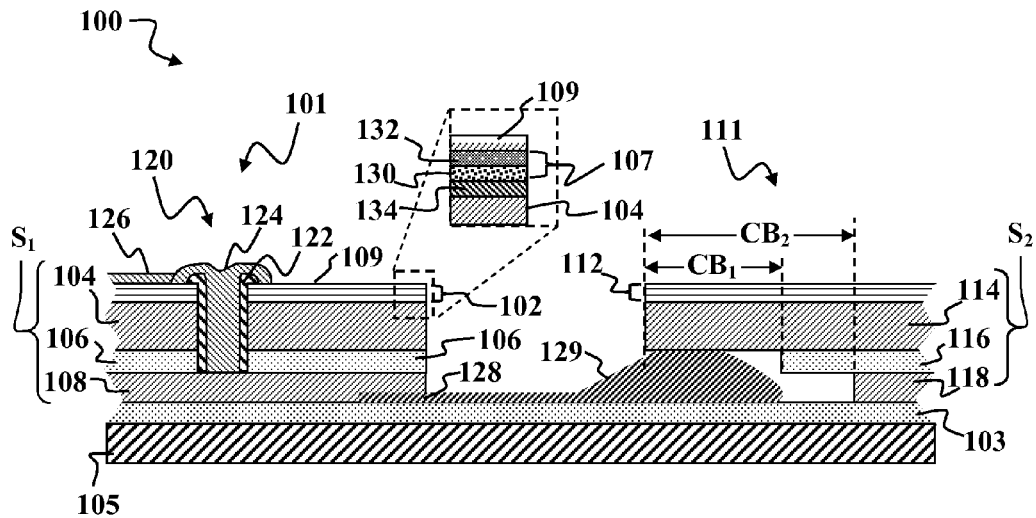
FIG. 1A
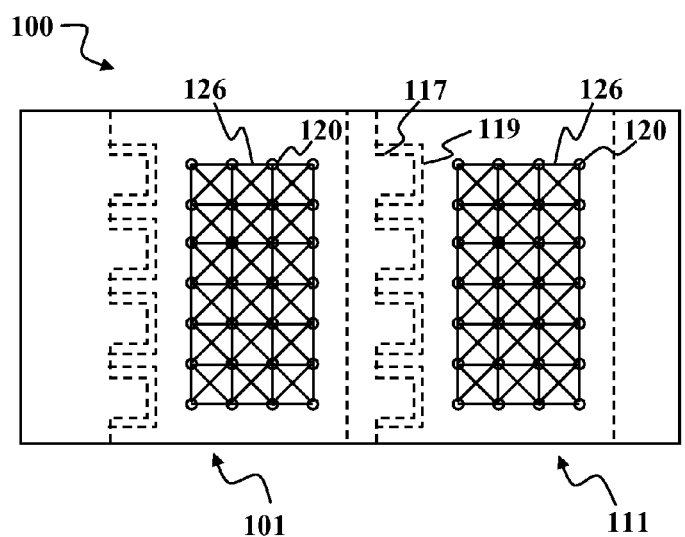
FIG. 1B
FIG. 1C
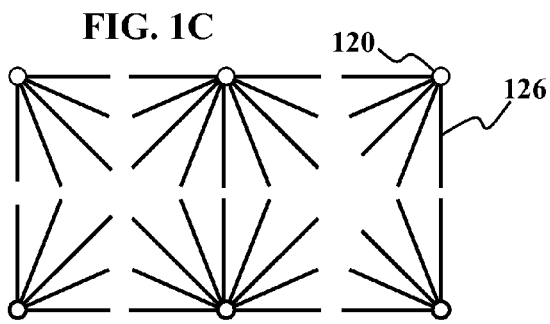
FIG. 1D
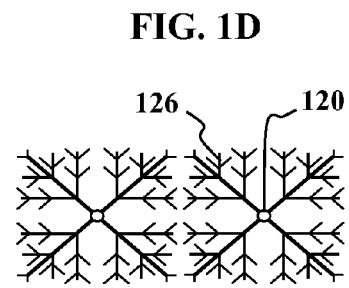

OPTOELECTRONIC ARCHITECTURE HAVING COMPOUND CONDUCTING SUBSTRATE

CROSS-REFERENCE TO RELATED APPLICATION

This application is a continuation of U.S. patent application Ser. No. 11/207,157 filed Aug. 16, 2005 now U.S. Pat. No. 7,838,868, which is a continuation-in-part of commonly-assigned, application Ser. No. 11/039,053, filed Jan. 20, 2005 now U.S. Pat. No. 7,276,724, the entire disclosures of which are incorporated herein by reference.

FIELD OF THE INVENTION

This invention relates to optoelectronic devices and more particularly to mass-manufacture of optoelectronic devices such as solar cells.

BACKGROUND OF THE INVENTION

Optoelectronic devices can convert radiant energy into electrical energy or vice versa. These devices generally include an active layer sandwiched between two electrodes, sometimes referred to as the front and back electrodes, at least one of which is typically transparent. The active layer typically includes one or more semiconductor materials. In a light-emitting device, e.g., a light-emitting diode (LED), a voltage applied between the two electrodes causes a current to flow through the active layer. The current causes the active layer to emit light. In a photovoltaic device, e.g., a solar cell, the active layer absorbs energy from light and converts this energy to electrical energy exhibited as a voltage and/or current between the two electrodes. Large scale arrays of such solar cells can potentially replace conventional electrical generating plants that rely on the burning of fossil fuels. However, in order for solar cells to provide a cost-effective alternative to conventional electric power generation the cost per watt generated must be competitive with current electric grid rates. Currently, there are a number of technical challenges to attaining this goal.

Most conventional solar cells rely on silicon-based semiconductors. In a typical silicon-based solar cell, a layer of n-type silicon (sometimes referred to as the emitter layer) is deposited on a layer of p-type silicon. Radiation absorbed proximate the junction between the p-type and n-type layers generates electrons and holes. The electrons are collected by an electrode in contact with the n-type layer and the holes are collected by an electrode in contact with the p-type layer. Since light must reach the junction, at least one of the electrodes must be at least partially transparent. Many current solar cell designs use a transparent conductive oxide (TCO) such as indium tin oxide (ITO) as a transparent electrode.

A further problem associated with existing solar fabrication techniques arises from the fact that individual optoelectronic devices produce only a relatively small voltage. Thus, it is often necessary to electrically connect several devices together in series in order to obtain higher voltages in order to take advantage of the efficiencies associated with high voltage, low current operation (e.g. power transmission through a circuit using relatively higher voltage, which reduces resistive losses that would otherwise occur during power transmission through a circuit using relatively higher current).

Several designs have been previously developed to interconnect solar cells into modules. For example, early photovoltaic module manufacturers attempted to use a "shingling" approach to interconnect solar cells, with the bottom of one cell placed on the top edge of the next, similar to the way shingles are laid on a roof. Unfortunately the solder and silicon wafer materials were not compatible. The differing rates of thermal expansion between silicon and solder and the rigidity of the wafers caused premature failure of the solder joints with temperature cycling.

A further problem associated with series interconnection of optoelectronic devices arises from the high electrical resistivity associated with the TCO used in the transparent electrode. The high resistivity restricts the size of the individual cells that are connected in series. To carry the current from one cell to the next the transparent electrode is often augmented with a conductive grid of busses and fingers formed on a TCO layer. However, the fingers and busses produce shadowing that reduces the overall efficiency of the cell. In order for the efficiency losses from resistance and shadowing to be small, the cells must be relatively small. Consequently, a large number of small cells must be connected together, which requires a large number of interconnects and more space between cells. Arrays of large numbers of small cells are relatively difficult and expensive to manufacture. Further, with flexible solar modules, shingling is also disadvantageous in that the interconnection of a large number of shingles is relatively complex, time-consuming and labor-intensive, and therefore costly during the module installation process.

To overcome this, optoelectronic devices have been developed with electrically isolated conductive contacts that pass through the cell from a transparent "front" electrode through the active layer and the "back" electrode to an electrically isolated electrode located beneath the back electrode. U.S. Pat. No. 3,903,427 describes an example of the use of such contacts in silicon-based solar cells. Although this technique does reduce resistive losses and can improve the overall efficiency of solar cell devices, the costs of silicon-based solar cells remains high due to the vacuum processing techniques used in fabricating the cells as well as the expense of thick, single-crystal silicon wafers.

This has led solar cell researchers and manufacturers to develop different types of solar cells that can be fabricated less expensively and on a larger scale than conventional silicon-based solar cells. Examples of such solar cells include cells with active absorber layers comprised of silicon (e.g. for amorphous, micro-crystalline, or polycrystalline silicon cells), organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells), copper-indium-gallium-selenium (for CIG solar cells), cells whose active layer is comprised of CdSe, CdTe, and combinations of the above, where the active materials are present in any of several forms including but not limited to bulk materials, micro-particles, nano-particles, or quantum dots. Many of these types of cells can be fabricated on flexible substrates (e.g., stainless steel foil). Although these types of active layers can be manufactured in non-vacuum environments, the intra-cell and inter-cell electrical connection typically requires vacuum deposition of one or more metal conducting layers.

For example FIG. 6A illustrates a portion of a prior art solar cell array 600. The array 600 is manufactured on a flexible insulating substrate 602. Series interconnect holes 604 are formed through the substrate 602 and a bottom electrode layer 606 is deposited, e.g., by sputtering, on a front surface of the substrate and on sidewalls of the holes. Current collection holes 608 are then formed through the bottom electrode and substrate at selected locations and one or more semiconductor layers 610 are then deposited over the bottom electrode 606 and the sidewalls of the series interconnect holes 604 and current collection holes 608. A transparent conductor layer 612 is then deposited using a shadow mask that covers the series interconnect holes 604. A second metal layer 614 is then deposited over the backside of the substrate 602 making electrical contact with the transparent conductor layer 612 through the current collection holes and providing series interconnection between cells through the series interconnect holes. Laser scribing 616, 618 on the front side and the back side separates the monolithic device into individual cells.

FIG. 6B depicts another prior art array 620 that is a variation on the array 600. The array 620 is also manufactured on a flexible insulating substrate 622. Series interconnect holes 624 are formed through the substrate 622 and a bottom electrode layer 626 is deposited, e.g., by sputtering, on front and back surfaces of the substrate 622 and on sidewalls of the holes 624. Current collection holes 628 are then formed through the bottom electrode and substrate at selected locations and one or more semiconductor layers 630 and a transparent conducting layer 632 are then deposited over the bottom electrode 626 on the front side and on the sidewalls of the series interconnect holes 624 and current collection holes 628. A second metal layer 634 is then deposited over the backside of the substrate 622 using a shadow mask that covers everything except the current collection holes 628 making electrical contact with the transparent conductor layer 632. Laser scribing 636,638 on the front side and the back side separates the monolithic device into individual cells.

There are two significant drawbacks to manufacturing solar cell arrays as shown in FIGS. 6A-6B. First, the metal layers are deposited by sputtering, which is a vacuum technique. Vacuum techniques are relatively, slow, difficult and expensive to implement in large scale roll-to-roll manufacturing environments. Secondly, the manufacturing process produces a monolithic array and sorting of individual cells for yield is not possible. This means that only a few bad cells can ruin the array and therefore increase cost. In addition, the manufacturing process is very sensitive to the morphology and size of the holes. Since the front to back electrical conduction is along the sidewall of the hole, making the holes larger does not increase conductivity enough. Thus, there is a narrow process window, which can add to the cost of manufacture and reduce yield of usable devices. Furthermore, although vacuum deposition is practical for amorphous silicon semiconductor layers, it is impractical for highly efficient solar cells based, e.g., on combinations of Copper, Indium, Gallium and Selenium or Sulfur, sometimes referred to as CIGS cells. To deposit a CIGS layer, three or four elements must be deposited in a precisely controlled ratio. This is extremely difficult to achieve using vacuum deposition processes.

Thus, there is a need in the art, for an optoelectronic device architecture that overcomes the above disadvantages and a corresponding method to manufacture such cells.

BRIEF DESCRIPTION OF THE DRAWINGS

The teachings of the present invention can be readily understood by considering the following detailed description in conjunction with the accompanying drawings, in which:

FIG. 1A is a vertical cross-sectional schematic diagram of a portion of an array of optoelectronic devices according to an embodiment of the present invention;

FIG. 1B is a plan view schematic diagram of the array of FIG. 1A.

FIGS. 1C-1D are plan view schematic diagrams illustrating alternative trace patterns for an optoelectronic device of the type shown in FIGS. 1A-1B.

DESCRIPTION OF THE SPECIFIC EMBODIMENTS

Figure 2:
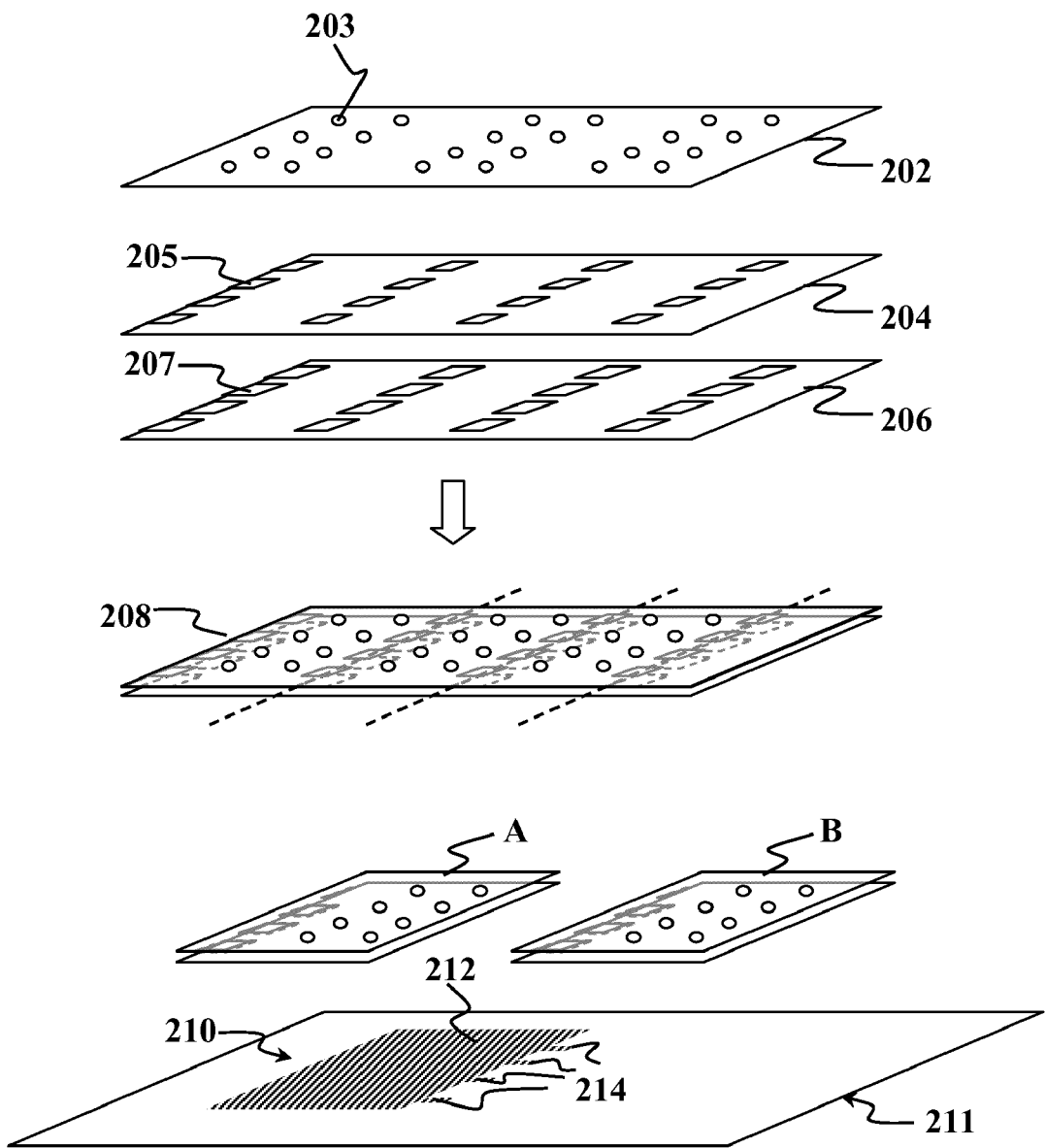
FIG. 2 is a sequence of schematic diagrams illustrating fabrication of an array of optoelectronic devices according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

FIGS. 1A-1B illustrates an array 100 of optoelectronic devices according to an embodiment of the present invention. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene teraphthalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

The device modules 101, 111, which may be about 4 inches in length and 12 inches wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a conductive back plane 108, 118. The bottom electrodes 104, 114, insulating layers 106, 116 and back planes 108, 118 for substrates $S_1$, $S_2$ on which the device layers 102, 112 are formed.

In contrast to prior art cells, where the substrates are formed by depositing thin metal layers on an insulating substrate, embodiments of the present invention utilize substrates $S_1$, $S_2$ based on flexible bulk conducting materials, such as foils. Although bulk materials such as foils are thicker than prior art vacuum deposited metal layers they can also be cheaper, more readily available and easier to work with. Preferably, at least the bottom electrode 104, 114 is made of a metal foil, such as aluminum foil. Alternatively, copper, stainless steel, titanium, molybdenum or other suitable metal foils may be used. By way of example, the bottom electrodes 104, 114 and back planes 108, 118 may be made of aluminum foil about 1 micron to about 200 microns thick, preferably about 25 microns to about 100 microns thick; the insulating layers 106, 116 may be made of a plastic foil material, such as polyethylene teraphthalate (PET) about 1 micron to about 200 microns thick, preferably about 10 microns to about 50 microns thick. In one embodiment, among others, the bottom electrode 104,114, insulating layer 106, 116 and back plane 108, 118 are laminated together to form the starting substrates $S_1$, $S_2$. Although foils may be used for both the bottom electrode 104, 114 and the back plane 108, 118 it is also possible to use a mesh grid on the back of the insulating layer 106, 116 as a back plane. Such a grid may be printed onto the back of the insulating layer 106, 116 using a conductive ink or paint. One example, among others, of a suitable conductive paint or ink is Dow Corning® PI-2000 Highly Conductive Silver Ink available from Dow Corning Corporation of Midland Mich. Dow Corning® is a registered trademark of Dow Corning Corporation of Midland Mich. Furthermore, the insulating layer 106, 116 may be formed by anodizing a surface of a foil used for the bottom electrode 104, 114 or back plane 108, 118 or both, or by applying an insulating coating by spraying, coating, or printing techniques known in the art.

The device layers 102, 112 generally include an active layer 107 disposed between a transparent conductive layer 109 and the bottom electrode 104. By way of example, the device layers 102, 112 may be about 2 microns thick. At least the first device 101 includes one or more electrical contacts 120 between the transparent conducting layer 109 and the back plane 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the back plane 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 0.1 millimeters to about 1.5 millimeters, preferably 0.5 millimeters to about 1 millimeter in diameter. The vias may be formed by punching or by drilling, for example by mechanical, laser or electron beam drilling, or by a combination of these techniques. An insulating material 122 coats sidewalls of the via such that a channel is formed through the insulating material 122 to the back plane 108. The insulating material 122 may have a thickness between about 1 micron and about 200 microns, preferably between about 10 microns and about 200 microns.

The insulating material 122 should preferably be at least 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the back plane 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for solvent removal and curing. The plug 124 may have a diameter between about 5 microns and about 500 microns, preferably between about 25 and about 100 microns.

The formation of good contacts between the conductive plug 124 and the substrate 108 may be assisted by the use of other interface-forming techniques such as ultrasonic welding. An example of a useful technique is the formation of gold stud-bumps, as described for example by J. Jay Wimer in "3-D Chip Scale with Lead-Free Processes" in Semiconductor International, Oct. 1, 2003, which is incorporated herein by reference. Ordinary solders or conductive inks or adhesives may be printed on top of the stud bump.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide. Alternatively, a chemical etching process may be used to remove the transparent conductor over a diameter slightly greater than the via. The etching can be localized, e.g., by printing drops of etchant in the appropriate places using inkjet printing or stencil printing.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. When a hole is drilled or punched through this structure, there is a layer of insulator between the transparent conducting layer 109 and the bottom electrode 104 which may be relatively thick compared to these layers and to the precision of mechanical cutting processes, so that no short can occur.

The material for this layer can be any convenient insulator, preferably one that can be digitally (e.g. inkjet) printed. Thermoplastic polymers such as Nylon PA6 (melting point (m.p.) 223° C.), acetal (m.p. 165° C.), PBT (structurally similar to PET but with a butyl group replacing the ethyl group) (m.p. 217° C.), and polypropylene (m.p. 165° C.), are examples which by no means exhaust the list of useful materials. These materials may also be used for the insulating layer 122. While inkjet printing is a desirable way to form the insulator islands, other methods of printing or deposition (including conventional photolithography) are also within the scope of the invention.

In forming the vias, it is useful to fabricate the optoelectronic device in at least two initially separate elements, with one comprised of the insulating layer 106, the bottom electrode 104 and the layers 102 above it, and the second comprised of the back plane 108. These two elements are then laminated together after the vias have been formed through the composite structure 106/104/102, but before the vias are filled. After this lamination and via formation, the back plane 108 is laminated to the composite, and the vias are filled as described above.

Although jet-printed solders or conductive adhesives comprise useful materials for forming the conductive via plug 124, it is also possible to form this plug by mechanical means. Thus, for example, a wire of suitable diameter may be placed in the via, forced into contact with the back plane 108, and cut off at the desired height to form the plug 124, in a manner analogous to the formation of gold stud bumps. Alternatively a pre-formed pin of this size can be placed into the hole by a robotic arm. Such pins or wires can be held in place, and their electrical connection to the substrate assisted or assured, by the printing of a very thin layer of conductive adhesive prior to placement of the pin. In this way the problem of long drying time for a thick plug of conductive adhesive is eliminated. The pin can have tips or serrations on it which punch slightly into the back plane 108, further assisting contact. Such pins may be provided with insulation already present, as in the case of insulated wire or coated wire (e.g. by vapor deposition or oxidation). They can be placed in the via before the application of the insulating material, making it easier to introduce this material.

If the pin is made of a suitably hard metal, and has a slightly tapered tip, it may be used to form the via during the punching step. Instead of using a punch or drill, the pin is inserted into the composite 106/104/102, to a depth such that the tip just penetrates the bottom; then when the substrate 108 is laminated to this composite, the tip penetrates slightly into it and forms a good contact. These pins may be injected into the unpunched substrate by, for example, mechanical pressure or air pressure directed through a tube into which the pin just fits.

One or more conductive traces 126, e.g., made of Al, Ni, or Ag, may be disposed on the transparent conducting layer 109 in electrical contact with the electrically conductive material 124. As shown in FIG. 1B, the traces 126 may interconnect multiple contacts 120 to reduce the overall sheet resistance. By way of example, the contacts 120 may be spaced about 1 centimeter apart from one another with the traces 126 connecting each contact to the transparent conductor surrounding it. Preferably, the number, width and spacing of the traces 126 is chosen such that the contacts 120 and traces 126 cover less than about 1% of the surface of the device module 101. The traces 126 may have a width between about 1 micron and about 200 microns, preferably between about 5 microns and about 50 microns. The traces 126 may be separated by center-to-center distances between about 0.1 millimeter and about 10 millimeters, preferably between about 0.5 millimeter and about 2 millimeters. Wider lines require a larger separation in order to avoid excessive shadowing loss. A variety of patterns or orientations for the traces 126 may be used so long as the lines are approximately equidistant from each other (e.g., to within a factor of two. An alternative pattern in which the traces 126 fan out from the contacts 120 is depicted in FIG. 1C. In another alternative pattern, shown in FIG. 1D, the traces 126 form a "watershed" pattern, in which thinner traces 126 branch out from thicker traces that radiate from the contacts 120. The trace patterns depicted in the examples shown in FIG. 1B and FIG. 1C are for the purpose of illustration and do not limit the possible trace patterns that may be used in embodiments of the present invention. Note that since the conductive back planes 108, 118 carry electrical current from one device module to the next the conductive traces 126 can include "fingers" while avoiding thick "busses". This reduces the amount of shadowing due to the busses and also provides a more aesthetically pleasing appearance to the device array 100.

Fabricating the device modules 101, 111 on substrates $S_1$, $S_2$ made of relatively thick, highly conductive, flexible bulk conductor bottom electrodes 104, 114 and backplanes 108, 118 and forming insulated electrical contracts 120 through the transparent conducting layer 109, the active layer 130, the bottom electrodes 104, 114 and the insulating layer 106, 116 allows the device modules 101, 111 to be relatively large. Consequently the array 100 can be made of fewer device modules requiring fewer series interconnections compared to prior art arrays. For example, the device modules 101, 111 may be between about 1 centimeter and about 30 centimeters long and between about 1 and about 30 centimeters wide. Smaller cells (e.g., less than 1 centimeter long and/or 1 centimeter wide) may also be made as desired.

Note that since the back planes 108, 118 carry electric current from one device module to the next, the pattern of traces 126 need not contain thick busses, as used in the prior art for this purpose. Instead, the pattern of traces 126 need only provide sufficiently conductive "fingers" to carry current to the contacts 120. In the absence of busses, a greater portion of the active layers 102, 112 is exposed, which enhances efficiency. In addition, a pattern of traces 126 without busses can be more aesthetically pleasing.

Electrical contact between the back plane 108 of the first device module 101 and the bottom electrode 114 of the second device module 111 may be implemented by cutting back the back plane 118 and insulating layer 116 of the second device module to expose a portion of the bottom electrode 114. FIG. 1B illustrates an example of one way, among others, for cutting back the back plane 118 and insulating layer 116. Specifically, notches 117 may be formed in an edge of the insulating layer 116. The notches 117 align with similar, but slightly larger notches 119 in the back plane 118. The alignment of the notches 117, 119 exposes portions of the bottom electrode 114 of the second device module 111.

Electrical contact may be made between the back plane 108 of the first device module 101 and the exposed portion of the bottom electrode 114 of the second device module 111 in a number of different ways. For example, as shown in FIG. 1A, thin conducting layer 128 may be disposed over a portion of the carrier substrate 103 in a pattern that aligns with the notches 117, 119.

The thin conducting layer may be, e.g., a conductive (filled) polymer or silver ink. The conducting layer can be extremely thin, e.g., about 1 micron thick. A general criteria for determining the minimum thickness of the thin conducting layer 128 is that the fractional power $p=(J/V)\rho(L_o^2/d)$ dissipated in this layer is about $10^{-5}$ or less, where J is the current density, V is the voltage, $L_o$ is the length of the thin conductive layer 128 (roughly the width of the gap between the first and second device modules) and $\rho$ and d are respectively the resistivity and the thickness of the thin conductive layer 128. By way of numerical example, for many applications (J/V) is roughly 0.06 A/Vcm². If $L_o$=400 microns=0.04 cm then p is approximately equal to $10^{-4}$ ($\rho$/d). Thus, even if the resistivity $\rho$ is about $10^{-5}$ $\Omega$cm (which is about ten times less than for a good bulk conductor), d can be about 1 micron ($10^{-4}$ cm) thick. Thus, even a relatively resistive polymer conductor of almost any plausible thickness will work.

The first device module 101 may be attached to the carrier substrate 103 such that the back plane 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 111. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the back plane 118 of the second device module 111. For example, the edge of the bottom electrode 114 may be cut back with respect to the insulating layer 116 by an amount of cutback $CB_1$ of about 400 microns. The back plane 118 may be cut back with respect to the insulating layer 116 by an amount $CB_2$ that is significantly larger than $CB_1$.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 1A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and US Patent Application Publication No. US 2004-0219730 A1 to Bulent Basol, published Nov. 4, 2004, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A contact layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the contact layer 134 may be a layer of molybdenum.

Although CIGS solar cells are described for the purposes of example, those of skill in the art will recognize that embodiments of the series interconnection technique can be applied to almost any type of solar cell architecture. Examples of such solar cells include, but are not limited to: cells based on amorphous silicon, Graetzel cell architecture (in which an optically transparent film comprised of titanium dioxide particles a few nanometers in size is coated with a monolayer of charge transfer dye to sensitize the film for light harvesting), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Furthermore, embodiments of the series interconnection technique described herein can be used with optoelectronic devices other than solar cells.

Alternatively, the optoelectronic devices 101, 111 may be light emitting devices, such as organic light emitting diodes (OLEDs). Examples of OLEDs include light-emitting polymer (LEP) based devices. In such a case, the active layer 107 may include a layer of poly (3,4) ethylendioxythiophene: polystyrene sulfonate (PEDOT:PSS), which may be deposited to a thickness of typically between 50 and 200 nm on the bottom electrodes 104, 114, e.g., by web coating or the like, and baked to remove water. PEDOT:PSS is available from Bayer Corporation of Leverkusen, Germany. A polyfluorene based LEP may then be deposited on the PEDOT:PSS layer (e.g., by web coating) to a thickness of about 60-70 nm. Suitable polyfluorene-based LEPs are available from Dow Chemicals Company.

The transparent conductive layer 109 may be, e.g., a transparent conductive oxide (TCO) such as zinc oxide (ZnO) or aluminum doped zinc oxide (ZnO:Al), which can be deposited using any of a variety of means including but not limited to sputtering, evaporation, CBD, electroplating, CVD, PVD, ALD, and the like. Alternatively, the transparent conductive layer 109 may include a transparent conductive polymeric layer, e.g. a transparent layer of doped PEDOT (Poly-3,4-Ethylenedioxythiophene), which can be deposited using spin, dip, or spray coating, and the like. PSS:PEDOT is a doped, conducting polymer based on a heterocyclic thiophene ring bridged by a diether. A water dispersion of PEDOT doped with poly(styrenesulfonate) (PSS) is available from H.C. Starck of Newton, Massachussetts under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT may chemically attack, react with, or otherwise degrade the other materials in the solar cell. Removal of acidic components in PEDOT may be carried out by anion exchange procedures. Non-acidic PEDOT can be purchased commercially. Alternatively, similar materials can be purchased from TDA materials of Wheat Ridge, Colo., e.g. Oligotron™ and Aedotron™.

The gap between the first device module 101 and the second device module 111 may be filled with a curable polymer epoxy, e.g., silicone. An optional encapsulant layer (not shown) may cover the array 100 to provide environmental resistance, e.g., protection against exposure to water or air. The encapsulant may also absorb UV-light to protect the underlying layers. Examples of suitable encapsulant materials include one or more layers of fluoropolymers such as THV (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. Patent Application Publication US 2005-0095422 A1, to Brian Sager and Martin Roscheisen, entitled "INORGANIC/ORGANIC HYBRID NANOLAMINATE BARRIER FILM" which is incorporated herein by reference), and combinations of the above.

There are a number of different methods of fabricating interconnected devices according to embodiments of the present invention. For example, FIG. 2 illustrates one such method. In this method the devices are fabricated on a continuous device sheet 202 that includes an active layer between a bottom electrode and a transparent conductive layer, e.g., as described above with respect to FIGS. 1A-1B. The device sheet 202 is also patterned with contacts 203 like the contact 120 depicted in FIG. 1A. The contacts 203 may be electrically connected by conductive traces (not shown) as described above. An insulating layer 204 and a back plane 206 are also fabricated as continuous sheets. In the example shown in FIG. 2, the insulating layer 204 has been cut back, e.g., to form notches 205 that align with similar notches 207 in the back plane layer 206. The notches in the back plane layer 206 are larger than the notches in the insulating layer 204. The device sheet 202, insulating layer 204 and back plane layer are laminated together to form a laminate 208 having the insulating layer 204 between the device sheet 202 and the back plane 206. The laminate 208 is then cut into two or more device modules A,B along the dashed lines that intersect the notches 205, 207. A pattern of conductive adhesive 210 (e.g., a conductive polymer or silver ink) is then disposed on a carrier substrate 211. The modules are adhered to the carrier substrate 211. A larger area 212 of the conductive adhesive 210 makes electrical contact with the backplane 206 of module A. Fingers 214 of conductive adhesive 210 project out from the larger area 212. The fingers 214 align with the notches 205, 207 of module B. Extra conductive adhesive may be placed on the fingers 214 to facilitate electrical contact with the bottom electrode of module B through the notches 205, 207. Preferably, the fingers 214 are narrower than the notches 207 in the back plane 206 so that the conductive adhesive 210 does not make undesired electrical contact with the back plane 206 of module B.

Figure 3:
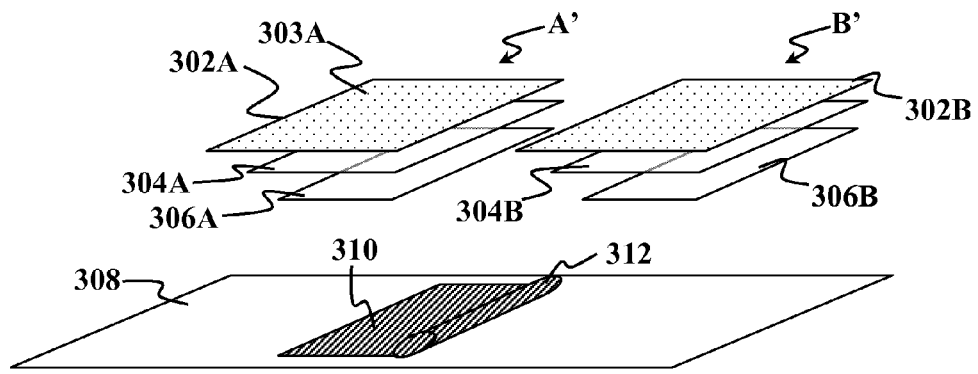
FIG. 3 is an exploded view schematic diagram illustrating fabrication of an array of optoelectronic devices according to an alternative embodiment of the present invention.

In the embodiment depicted in FIG. 2, the device sheet, insulating layer and back plane were laminated together before being cut into individual modules. In alternative embodiments, the layers may be cut first and then assembled into modules (e.g., by lamination). For example, as shown in FIG. 3, first and second device modules A', B' may be respectively laminated from pre-cut device layers 302A, 302B, insulating layers 304A, 304B, and back planes 306A, 306B. Each device layer 302A, 302B includes an active layer between a transparent conducting layer and a bottom electrode. At least one device layer 302A includes electrical contacts 303A (and optional conductive traces) of the type described above.

In this example, the back plane layer 306B of module B has been cut back by simply making it shorter than the insulating layer 304B so that the insulating layer 304B overhangs an edge of the back plane layer 306B. Similarly, the insulating layer 304B has been cut back by making it shorter than the device layer 302B or, more specifically, shorter than the bottom electrode of device layer 302B. After the pre-cut layers have been laminated together to form the modules A', B' the modules are attached to a carrier substrate 308 and electrical connection is made between the back plane 306A of module A' and the bottom electrode of the device layer 302B of module B'. In the example shown in FIG. 3, the connection is made through a conductive adhesive 310 with a raised portion 312, which makes contact with the bottom electrode while avoiding undesired contact with the back plane 306B of module B'.

Figure 4A:
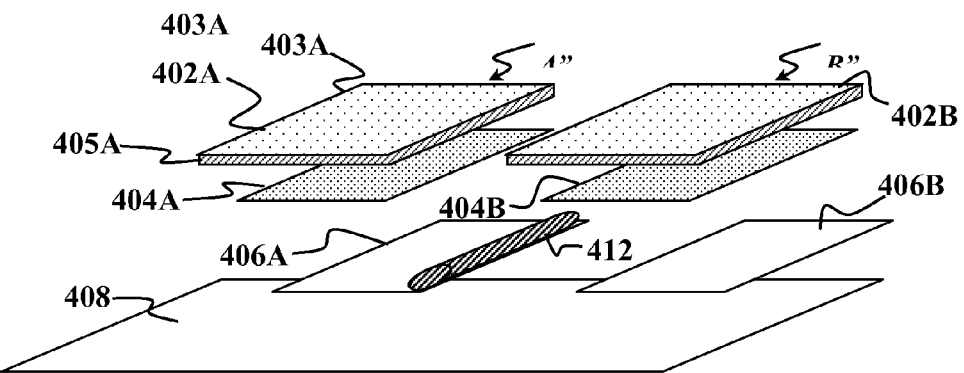
FIG. 4A is an exploded view schematic diagram illustrating fabrication of an array of optoelectronic devices according to another alternative embodiment of the present invention.
Figure 4B:
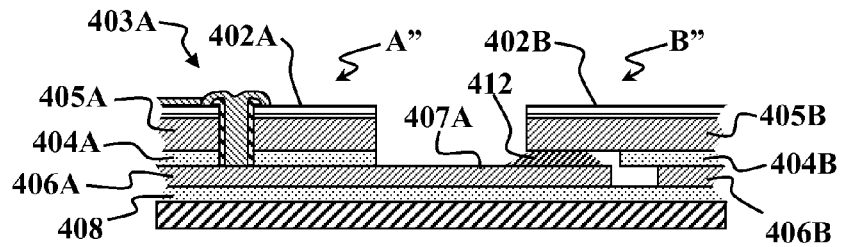
FIG. 4B is a cross-sectional schematic diagram illustrating a portion of the array of FIG. 4A.

FIGS. 4A-4B depict a variation on the method depicted in FIG. 3 that reduces the use of conductive adhesive. First and second device modules A", B" are assembled from pre-cut device layers 402A, 402B, insulating layers 404A, 404B and back plane layers 406A, 406B and attached to a carrier substrate 408. Insulated electrical contacts 403A make electrical contact through the device layers 402A, a bottom electrode 405A and the insulating layer 406A as shown in FIG. 4B. Front edges of the insulating layer 404B and back plane 406B of module B" are cut back with respect to the device layer 402B as described above with respect to FIG. 3. To facilitate electrical contact, however, a back edge of the back plane 406A of module A" extends beyond the back edges of the device layer 402A and insulating layer 404A. As a result, the device layer 402B of module B" overlaps the back plane 406A of module A". A ridge of conductive adhesive 412 on an exposed portion 407A of the back plane 406A makes electrical contact with an exposed portion of a bottom electrode 405B of the device layer 402B as shown in FIG. 4B.

In preferred embodiments of the methods described above, individual modules may be fabricated, e.g., as described above, and then sorted for yield. For example, two or more device modules may be tested for one or more performance characteristics such as optoelectronic efficiency, open circuit voltage, short circuit current, fill factor, etc. Device modules that meet or exceed acceptance criteria for the performance characteristics may be used in an array, while those that fail to meet acceptance criteria may be discarded. Examples of acceptance criteria include threshold values or acceptable ranges for optoelectronic efficiency or open circuit voltage. By sorting the device modules individually and forming them into arrays, higher yields may be obtained than by fabricating arrays of devices monolithically.

Figure 5A:
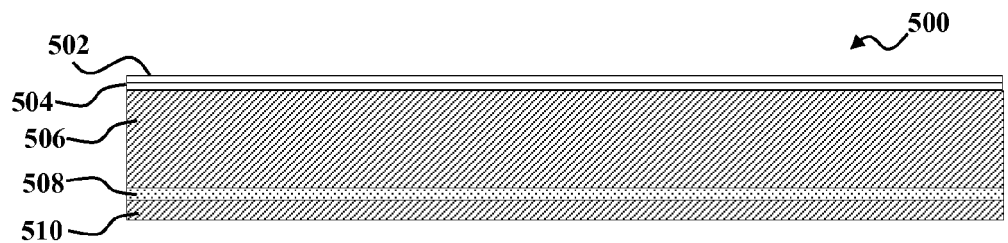
FIGS. 5A-5I are cross-sectional schematic diagrams illustrating formation of electrical contacts according to embodiments of the present invention.

In the discussion of the electrical contacts 120 between the transparent conductive layer and the back plane, vias were formed, coated with an insulating material and filled with a conductive material. In an alternative embodiment, connection between the transparent conductive layer and the back plane may be effected using a portion of the bottom electrode as part of the electrical contact. FIGS. 5A-5H illustrate examples of how this may be implemented. Specifically, one may start with a structure 500 (as shown in FIG. 5A) with a transparent conducting layer 502 (e.g., Al:ZnO, i:ZnO), an active layer 504 (e.g., CIGS), a bottom electrode 506 (e.g., 100 um Al), an insulating layer 508 (e.g., 50 um PET), and a back plane 510 (e.g., 25 um Al). Preferably, the back plane 510 is in the form of a thin aluminum tape that is laminated to the bottom electrode 506 using an insulating adhesive as the insulating layer 508. This can greatly simplify manufacture and reduce materials costs.

Figure 5B:
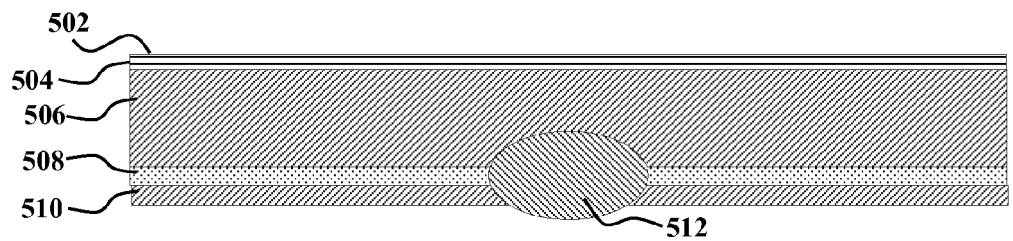

Electrical connection 512 may be made between the bottom electrode 506 and the back plane at one or more locations as shown in FIG. 5B. For example, a spot weld may be formed through insulating layer 508, e.g., using laser welding. Such a process is attractive by virtue of making the electrical connection in a single step. Alternatively, the electrical connection 512 may be formed through a process of drilling a blind hole through the back plane 510 and the insulating layer 508 to the bottom electrode and filling the blind hole with an electrically conductive material such as a solder or conductive adhesive.

Figure 5C:
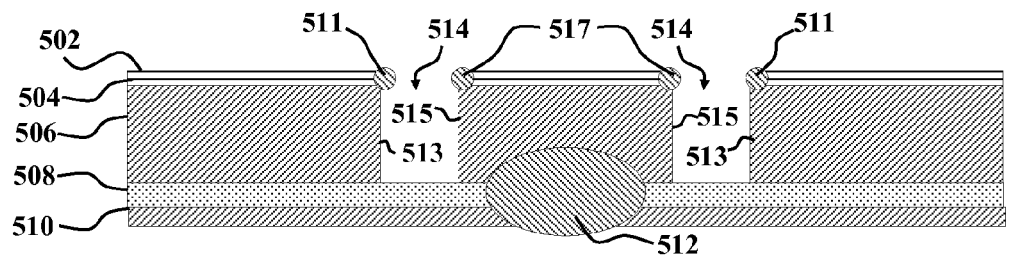

As shown in FIG. 5C, a trench 514 is then formed in a closed loop (e.g., a circle) around the electrical connection 512. The closed-loop trench 514 cuts through the transparent conducting layer 502, active layer 504, and bottom electrode 506, to the back plane 510. The trench 514 isolates a portion of the bottom electrode 506, active layer 504, and transparent conductive layer 502 from the rest of the structure 500. Techniques such as laser machining may be used to form the trench 514. If laser welding forms the electrical connection 512 with one laser beam and a second laser beam forms the trench 514, the two laser beams may be pre-aligned with respect to each other from opposite sides of the structure 500. With the two lasers pre-aligned, the electrical connection 512 and trench 514 may be formed in a single step, thereby enhancing the overall processing speed.

Figure 5D:
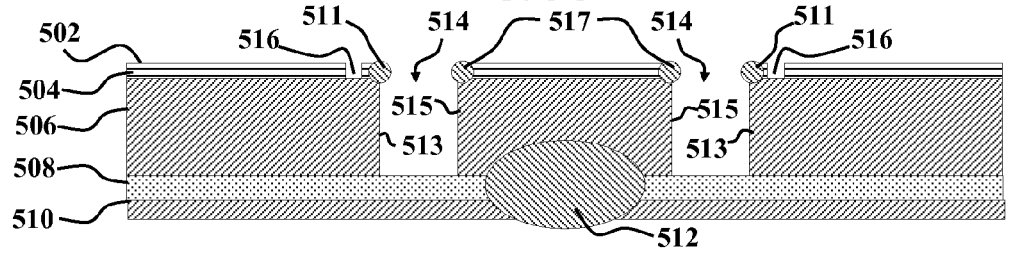

The process of forming the isolation trench may cause electrical short-circuits 511, 517 between the transparent conductive layer 502 and the bottom electrode 506. To electrically isolate undesirable short circuits 511 formed on an outside wall 513 of the trench 514 an isolation trench 516 is formed through the transparent conductive layer and the active layer to the bottom electrode 506 as shown in FIG. 5D. The isolation trench 516 surrounds the closed-loop trench 514 and electrically isolates the short circuits 511 on the outside wall 513 of the trench from the rest of the structure 500. A laser scribing process may form the isolation trench 516. A lesser thickness of material being scribed reduces the likelihood of undesired short circuits resulting from formation of the isolation trench 516.

Figure 5E:
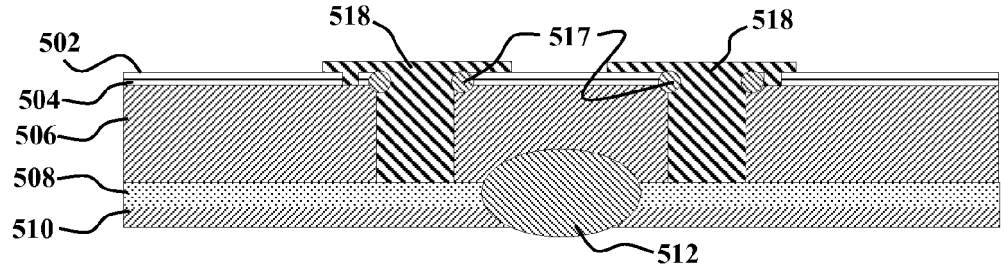
Figure 5F:
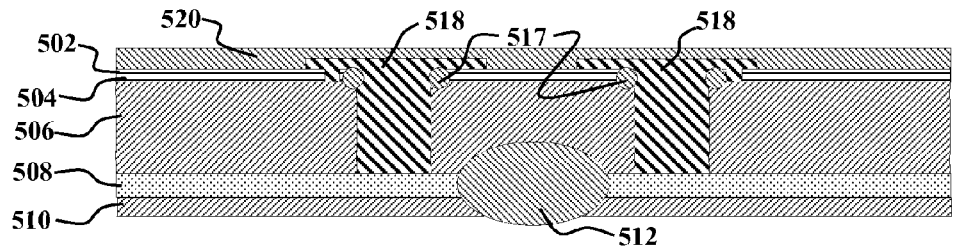

Not all short circuits between the transparent conducting layer 502 and the bottom electrode 506 are undesirable. Electrical shorts 517 along an inside wall 515 of the trench 514 can provide part of a desired electrical path to the electrical connection 512. If a sufficient amount of desirable short circuiting is present, the electrical contact may be completed as depicted in FIG. 5E-5F. First an insulating material 518 is deposited into the closed-loop trench 514 and isolation trench 516 e.g., in a "donut" pattern with a hole in the middle as shown in FIG. 5E. Next electrically conductive fingers 520 are deposited over portions of the structure 500 including the isolated portion surrounded by the trench 514 and non-isolated portions as depicted in FIG. 5F. The insulating material 518 may be deposited in a way that provides a sufficiently planar surface suitable for forming the conductive fingers 520. Electrical contact is then made between the transparent conducting layer 502 in the non-isolated portions outside the trench 514 and the back plane 510 through the fingers 520, the transparent conducting layer within the isolated portion, electrical shorts 517 on the inside wall of the trench 514, the portion of the bottom electrode 506 inside the trench 514 and the electrical connection 512.

Figure 5G:
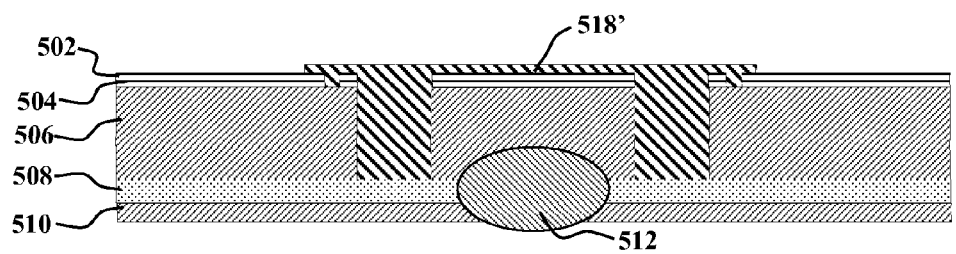
Figure 5H:
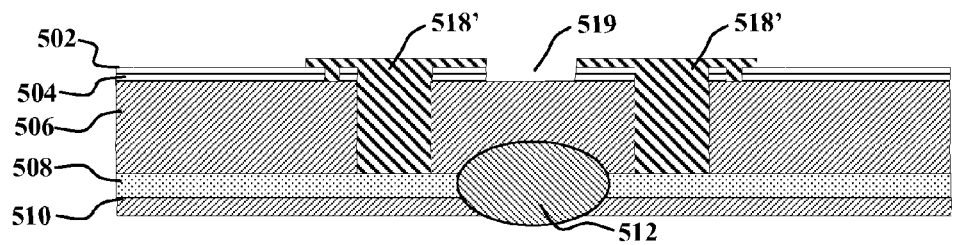
Figure 5I:
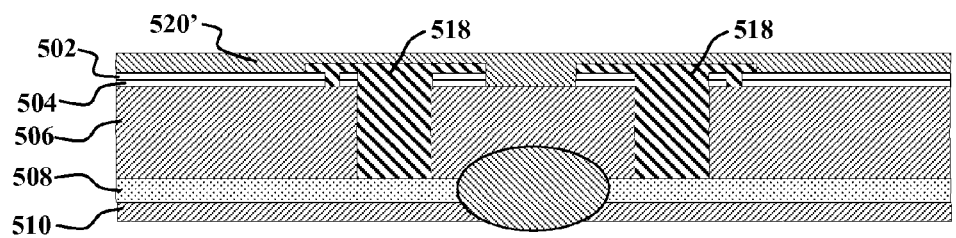
Figure 6A:
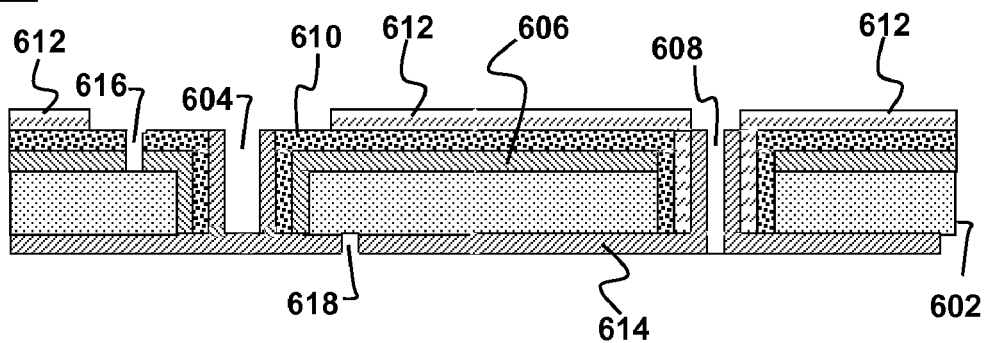
FIG. 6A is a cross-sectional schematic diagram of a portion of a solar cell array according to the prior art.
Figure 6B:
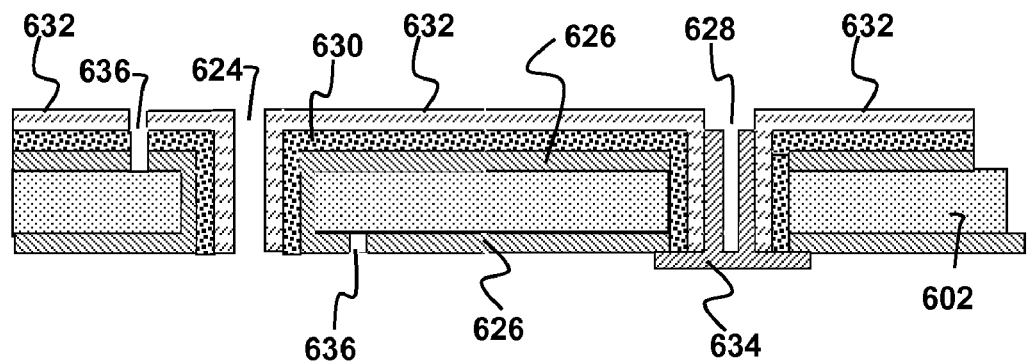
FIG. 6B is a cross-sectional schematic diagram of a portion of an alternative solar cell array according to the prior art.

Alternatively, if the shorts 517 do not provide sufficient electrical contact, a process of drilling and filling may provide electrical contact between the fingers 520 and the isolated portion of the bottom electrode 506. In an alternative embodiment depicted in FIGS. 5G-5I, it is possible that insulating material 518' covers the isolated portion when it is deposited as shown in FIG. 5G. The insulating material 518' covering the isolated portion may be removed, e.g., by laser machining or mechanical processes such as drilling or punching, along with corresponding portions of the transparent conductive layer 502 and the active layer 504 to expose the bottom electrode 506 through an opening 519 as shown in FIG. 5H. Electrically conductive material 520' forms conductive fingers, as described above. The electrically conductive material makes contact with the exposed bottom electrode 506 through the opening 519 and completes the desired electrical contact as shown in FIG. 5I.

Note that there are several variations on the techniques described above with respect to FIGS. 5A-5I. For example, in some embodiments it may be desirable to make the electrical connection 512 after the closed-loop trench has been formed and filled with insulating material. There are several advantages of the above-described process for forming the electrical contact. The process steps are simplified. It is easier to deposit the insulating layer without worrying about covering up the back plane. The process allows for a planar surface for depositing the fingers 520, 520'. Reliable electrical contact can be made between the bottom electrode 506 and the back plane 510 through laser welding. Furthermore, electrical shorts can be isolated without jeopardizing a 100% yield.

Embodiments of the present invention facilitate relatively low cost manufacture of large-scale arrays of series-connected optoelectronic devices. Larger devices may be connected in series due to the reduced sheet resistance as a result of the connection between back planes and the transparent conducting layers through the contacts that penetrate the layers of the device modules. The conductive traces can further reduce sheet resistance. Larger devices can be arrayed with fewer connections.

Although for the purpose of illustration, the examples described herein show only two optoelectronic device modules connected in series, it will be appreciated that three or more such device modules may be so connected in accordance with embodiments of the present invention.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An optoelectronic device module, comprising:
a starting substrate having a bottom electrode made of a flexible bulk conductor, an insulator layer and a conductive back plane, wherein the insulator layer is sandwiched between the bottom electrode and the conductive back plane;
an active layer and a transparent conducting layer disposed such that the active layer is between the bottom electrode and the transparent conducting layer;
one or more electrical contacts between the transparent conducting layer and the conductive back plane, the electrical contracts being formed through the transparent conducting layer, the active layer, the flexible bulk conductor and the insulator layer, wherein the electrical contacts are not directly electrically coupled to the active layer and the bottom electrode.

2. The device module of claim 1 wherein the flexible bulk conductor is a first metal foil.

3. The device module of claim 2 wherein the first metal foil is an aluminum foil.

4. The device module of claim 2 wherein the first metal foil is between about 1 micron thick and about 200 microns thick.

5. The device module of claim 4 wherein the first metal foil is between about 25 microns thick and about 50 microns thick.

6. The device module of claim 2 wherein the conductive back plane is a conductive grid.

7. The device module of claim 2 wherein the insulator layer is an anodized surface of the first metal foil.

8. The device module of claim 2 wherein the conductive back plane is a second metal foil.

9. The device module of claim 8 wherein the insulator layer is laminated between the first and second metal foils.

10. The device module of claim 8 wherein the insulator layer is made of plastic foil.

11. The device module of claim 10 wherein the plastic foil is between about 1 micron thick and about 200 microns thick.

12. The device module of claim 11 wherein the plastic foil is between about 10 microns thick and about 50 microns thick.

13. The device module of claim 8 wherein the second metal foil is between about 1 micron thick and about 200 microns thick.

14. The device module of claim 13 wherein the second metal foil is between about 25 microns thick and about 50 microns thick.

15. The device module of claim 8 wherein the insulator layer is an anodized surface of the first and or second metal foil.

16. The device module of claim 1 wherein the one or more electrical contacts between the transparent conducting layer and the conductive back plane include:
- a via formed through the transparent conducting layer, the active layer, the flexible bulk conductor and the insulator layer of the first device module;
- an insulating material coating sidewalls of the via such that a channel is formed through the transparent conducting layer, the active layer, the flexible bulk conductor and the insulator layer to the conductive back plane;
- a plug made of an electrically conductive material that at least substantially fills the channel and is configured to carry electric current between the transparent conducting layer and the conductive back plane.

17. The device module of claim 16 wherein the via is between about 0.1 millimeters in diameter and about 1.5 millimeters in diameter.

18. The device module of claim 17 wherein the via is between about 0.5 millimeters in diameter and about 1 millimeter in diameter.

19. The device module of claim 17 wherein the insulating material is between about 1 micron thick and about 200 microns thick along the via sidewall.

20. The device module of claim 19 wherein the insulating material is between about 10 microns thick and about 100 microns thick along the via sidewall.

* * * * *